(12) United States Patent
Brenninger

(10) Patent No.: US 9,153,472 B2
(45) Date of Patent: Oct. 6, 2015

(54) DEVICE FOR DEPOSITING A LAYER ON A SEMICONDUCTOR WAFER BY MEANS OF VAPOUR DEPOSITION

(71) Applicant: SILTRONIC AG, Munich (DE)

(72) Inventor: Georg Brenninger, Oberbergkirchen (DE)

(73) Assignee: Siltronic AG, Munich (DE)

( * ) Notice: Subject to any disclaimer, the term of this patent is extended or adjusted under 35 U.S.C. 154(b) by 0 days.

(21) Appl. No.: 14/389,944

(22) PCT Filed: Mar. 22, 2013

(86) PCT No.: PCT/EP2013/056011
§ 371 (c)(1),
(2) Date: Oct. 1, 2014

(87) PCT Pub. No.: WO2013/149849
PCT Pub. Date: Oct. 10, 2013

(65) Prior Publication Data
US 2015/0056787 A1  Feb. 26, 2015

(30) Foreign Application Priority Data

Apr. 4, 2012  (DE) .......................... 10 2012 205 616

(51) Int. Cl.
| C23C 16/458 | (2006.01) |
| H01L 21/67 | (2006.01) |
| H01L 21/687 | (2006.01) |
| C23C 16/46 | (2006.01) |
| C23C 16/455 | (2006.01) |
| H01L 21/02 | (2006.01) |
| H01L 21/20 | (2006.01) |

(52) U.S. Cl.
CPC ....... *H01L 21/68785* (2013.01); *C23C 16/4584* (2013.01); *C23C 16/4586* (2013.01); *C23C 16/45502* (2013.01); *C23C 16/466* (2013.01); *H01L 21/0262* (2013.01); *H01L 21/02381* (2013.01); *H01L 21/02532* (2013.01); *H01L 21/67253* (2013.01)

(58) Field of Classification Search
CPC ................ C23C 14/541–14/545; C23C 16/00; C23C 16/463–16/466; C23C 16/4584; C23C 16/45502; H01L 21/67253; H01L 21/68785
See application file for complete search history.

(56) References Cited

U.S. PATENT DOCUMENTS

| 4,821,674 A | 4/1989 | deBoer et al. |
| 5,062,386 A * | 11/1991 | Christensen ................. 118/725 |
| 5,997,649 A * | 12/1999 | Hillman ........................ 118/715 |
| 7,541,293 B2 * | 6/2009 | Iwamoto et al. ............... 438/745 |
| 7,837,794 B2 * | 11/2010 | Ito et al. ......................... 117/200 |
| 2001/0009178 A1 * | 7/2001 | Tamura et al. ................. 156/345 |
| 2001/0054390 A1 | 12/2001 | Halpin et al. |
| 2002/0139307 A1 | 10/2002 | Ryding et al. |

(Continued)

FOREIGN PATENT DOCUMENTS

JP          05221790 A  *  8/1993  .............. C30B 25/14

*Primary Examiner* — William F Kraig
*Assistant Examiner* — Maliheh Malek
(74) *Attorney, Agent, or Firm* — Brooks Kushman P.C.

(57) ABSTRACT

Uniformity of vapor deposited coatings on semiconductor wafers is improved by employing an apparatus having a gas distributor head below a susceptor onto which the wafer is placed, the gas distributor head directing a fan of cooling gas at the rear side of the susceptor. The ratio of the diameter of the cooled section of the susceptor to the diameter D of the wafer is preferably from 0.1 to 0.4.

6 Claims, 3 Drawing Sheets

(56) References Cited

U.S. PATENT DOCUMENTS

| | | | |
|---|---|---|---|
| 2002/0171994 A1* | 11/2002 | Grimard et al. | 361/234 |
| 2003/0051665 A1* | 3/2003 | Zhao et al. | 118/723 E |
| 2003/0164226 A1* | 9/2003 | Kanno et al. | 156/345.51 |
| 2004/0011468 A1* | 1/2004 | Hirose et al. | 156/345.52 |
| 2004/0040508 A1* | 3/2004 | Shajii et al. | 118/724 |
| 2004/0144323 A1 | 7/2004 | Kai | |
| 2004/0187788 A1* | 9/2004 | Kellerman et al. | 118/728 |
| 2004/0238104 A1* | 12/2004 | Suzuki et al. | 156/163 |
| 2004/0261946 A1* | 12/2004 | Endoh et al. | 156/345.15 |
| 2005/0266685 A1* | 12/2005 | Nakano et al. | 438/660 |
| 2007/0059933 A1* | 3/2007 | Tahara et al. | 438/689 |
| 2007/0210037 A1* | 9/2007 | Ishida et al. | 219/121.43 |
| 2007/0215282 A1* | 9/2007 | Itabashi et al. | 156/345.33 |
| 2007/0241290 A1* | 10/2007 | Zhurin | 250/492.3 |
| 2008/0236477 A1* | 10/2008 | Ito et al. | 117/86 |
| 2008/0311294 A1* | 12/2008 | Ito et al. | 427/248.1 |
| 2009/0155934 A1* | 6/2009 | Nishimura et al. | 438/14 |
| 2009/0238971 A1* | 9/2009 | Higashi et al. | 427/255.5 |
| 2010/0263587 A1* | 10/2010 | Sivaramakrishnan et al. | 117/94 |
| 2011/0020545 A1 | 1/2011 | Kim et al. | |
| 2011/0312156 A1* | 12/2011 | Cattet et al. | 438/458 |
| 2012/0111271 A1* | 5/2012 | Begarney et al. | 118/724 |
| 2012/0171377 A1* | 7/2012 | Volf et al. | 427/255.28 |
| 2013/0068320 A1* | 3/2013 | Nguyen et al. | 137/334 |
| 2013/0078743 A1* | 3/2013 | Brenninger | 438/5 |
| 2014/0024221 A1* | 1/2014 | Maruyama et al. | 438/719 |
| 2014/0145214 A1* | 5/2014 | Kageshima et al. | 257/77 |
| 2014/0318442 A1* | 10/2014 | Sivaramakrishnan et al. | 117/102 |

* cited by examiner

DEVICE FOR DEPOSITING A LAYER ON A SEMICONDUCTOR WAFER BY MEANS OF VAPOUR DEPOSITION

CROSS REFERENCE TO RELATED APPLICATIONS

This application is the U.S. National Phase of PCT Appln. No. PCT/EP2013/056011 filed Mar. 22, 2013, which claims priority to German Application No. 10 2012 205 616.5 filed Apr. 4, 2012, the disclosures of which are incorporated in their entirety by reference herein.

BACKGROUND OF THE INVENTION

1. Field of the Invention

The invention relates to an apparatus for depositing a layer on a semiconductor wafer by means of vapor deposition, and to a method that uses the apparatus.

2. Description of the Related Art

US2004/0144323 A1 discloses an apparatus for depositing a layer on a semiconductor wafer, comprising an upper and a lower cover composed of transparent material and a side wall, which together define a reactor chamber. The reactor chamber is divided by a susceptor into an upper reactor chamber and a lower reactor chamber. The susceptor supports a semiconductor wafer to be coated and itself rests on arms of a supporting frame that forms the upper end of a shaft that rotates the susceptor and the semiconductor wafer. Upper and lower lamp banks heat the susceptor and the semiconductor wafer. A deposition gas is guided parallel to the surface of the semiconductor wafer through the upper reactor chamber and thermally decomposed in the process, wherein deposition products deposit to form a layer as uniformly thick as possible on the surface of the front side of the semiconductor wafer. At the same time, a purge gas is guided through the lower reactor chamber in order to prevent deposition gas or decomposition products thereof from passing to the rear side of the susceptor and to the rear side of the semiconductor wafer.

U.S. Pat. No. 4,821,674 discloses that purge gas can be guided through the shaft and through a gap existing between the shaft and a tube surrounding it, in order to prevent deposition gas from passing into the region below the susceptor.

Depositing a uniformly thick layer on a semiconductor wafer poses problems, however. Even after optimization of crucial process parameters such as the electrical power of the lamp banks and the volumetric flow rate of deposition gas and purge gas, it is ascertained after analysis of a coated semiconductor wafer that the layer thickness is somewhat greater in the center of the semiconductor wafer than in the edge region of the semiconductor wafer.

SUMMARY OF THE INVENTION

It has now been surprisingly and unexpectedly discovered that the increased layer thickness found in the center of the coated semiconductor wafers is attributable to a temperature increase in the center region of the susceptor, and that this local temperature increase cannot be avoided by optimization of process parameters. It is an object of the present invention to achieve a more uniform layer thickness.

These and other objects are achieved by an apparatus for depositing a layer on a semiconductor wafer by means of vapor deposition, comprising a susceptor having a front side and a rear side;

a shaft for rotating the susceptor, wherein the shaft has an upper and a lower end and is provided with a channel extending from the lower to the upper end;

a gas distributor head, which is fixed to the upper end of the shaft and cools a region of the rear side of the susceptor by means of a cooling gas, wherein the cooled region extends from the center of the susceptor radially outward; and a line for feeding cooling gas from a source to the lower end of the shaft, from where the cooling gas passes through the channel to the upper end of the shaft and into the distributor head and is directed to the rear side of the susceptor.

The invention also relates to a method wherein this apparatus is used.

DETAILED DESCRIPTION OF THE PREFERRED EMBODIMENT

Figure 1:
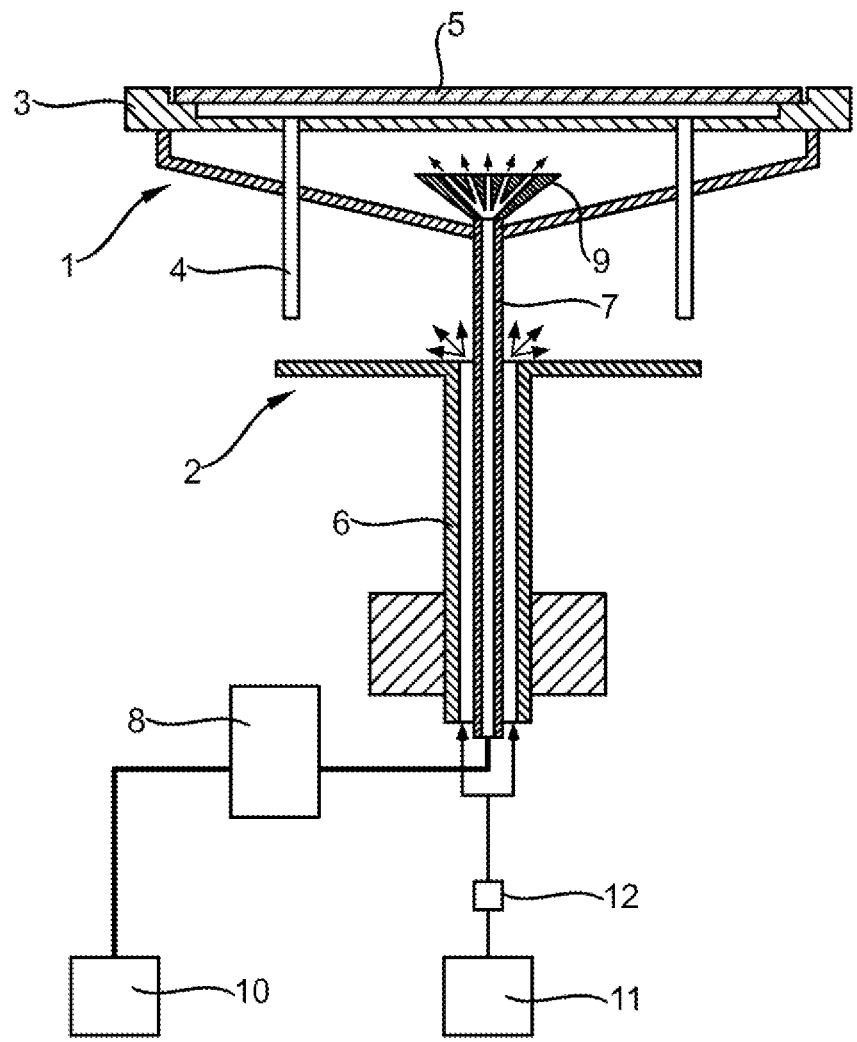
FIG. 1 illustrates a vertical section drawing through one embodiment of an apparatus of the invention, wherein some features that do not contribute to an understanding of the invention are not illustrated.

The cooling of a region of the rear side of the susceptor extending from the center of the susceptor radially outward ultimately also brings about a reduction of the temperature on the surface of the semiconductor wafer to be coated, in the center of the front side of the semiconductor wafer and in a region of the surface of the front side of the semiconductor wafer extending radially around the center. With the lower temperature, the rate of deposition of the layer in turn decreases, such that a radially more uniform layer thickness distribution can be achieved by means of the targeted cooling measure.

The cooling measure comprises the use of a gas distributor head, which directs and restricts the effect of the cooling gas to a region of the rear side of the susceptor which extends from the center of the susceptor radially outward. The diameter of the region is less than the diameter of the semiconductor wafer to be coated, and the ratio of the diameters d/D is preferably not less than 0.1 and not more than 0.4, wherein d denotes the diameter of the cooled region of the rear side of the susceptor and D denotes the diameter of a semiconductor wafer to be coated that is placed on the susceptor. The diameter of the cooled region must not become too large, because otherwise regions of the semiconductor wafer that should not be cooled are also cooled. However, the diameter must also not be too small, because otherwise regions of the semiconductor wafer which should be cooled are not cooled.

The gas distributor head can be embodied differently depending on the application. Preference is given to a gas distributor head which directs the flow of the outflowing cooling gas in a fanned-out fashion toward the rear side of the susceptor. The cooled region of the rear side of the susceptor is the region impinged on directly by the gas flow that leaves the gas distributor head. The gas distributor head preferably has a specific distance from the rear side of the susceptor and a specific opening angle for fanning out the gas flow.

An apparatus according to the invention preferably comprises a mass flow controller or mass flow limiter, which sets a volumetric flow rate of the cooling gas that cools the region of the rear side of the susceptor in such a way that it is not less than 1 slm and not more than 20 slm. In the case of a volumetric flow rate of more than 20 slm there is the risk of the effect of the cooling gas exceeding the intended effect and, ultimately, of less material than intended being deposited in the center of the surface of the semiconductor wafer.

The cooling gas is preferably hydrogen, nitrogen or a noble gas or any desired mixture of the gases mentioned.

The semiconductor wafer preferably consists of monocrystalline silicon. The deposited layer is preferably a layer composed of epitaxially deposited silicon which can be doped with an electrically active dopant. The diameter of the semiconductor wafer to be coated is preferably not less than 300 mm, more preferably 300 mm or 450 mm.

The invention is explained in greater detail below with reference to drawings.

The apparatus as shown in FIG. 1 comprises a susceptor 3, which supports a semiconductor wafer 5 to be coated and which itself rests on arms of a supporting frame 1. The supporting frame is seated together with a gas distributor head 9 on the upper end of a rotating shaft 7. The shaft is surrounded by a tube 6, which is extended at an upper end to form a supporting ring 2, on which lifting pins 4 for raising and lowering the semiconductor wafer 5 on the susceptor 3 are placed. There is a gap between the tube 6 and the shaft 7, said gap extending upward as far as the supporting ring. The lower end of the shaft is connected via a line to a gas source 10, which provides the cooling gas. A mass flow controller or mass flow limiter 8 is preferably integrated into this line, and controls or limits the volumetric flow rate of the cooling gas. In accordance with one preferred configuration of the invention, the apparatus comprises a further gas source 11, a further line and a further mass flow controller or mass flow limiter 12 for feeding this further gas. The further gas, which can have the composition of the cooling gas or a different composition, is used as a purge gas that keeps the exit region of the further gas at the upper end of the tube free of reactive gases.

Figure 2:
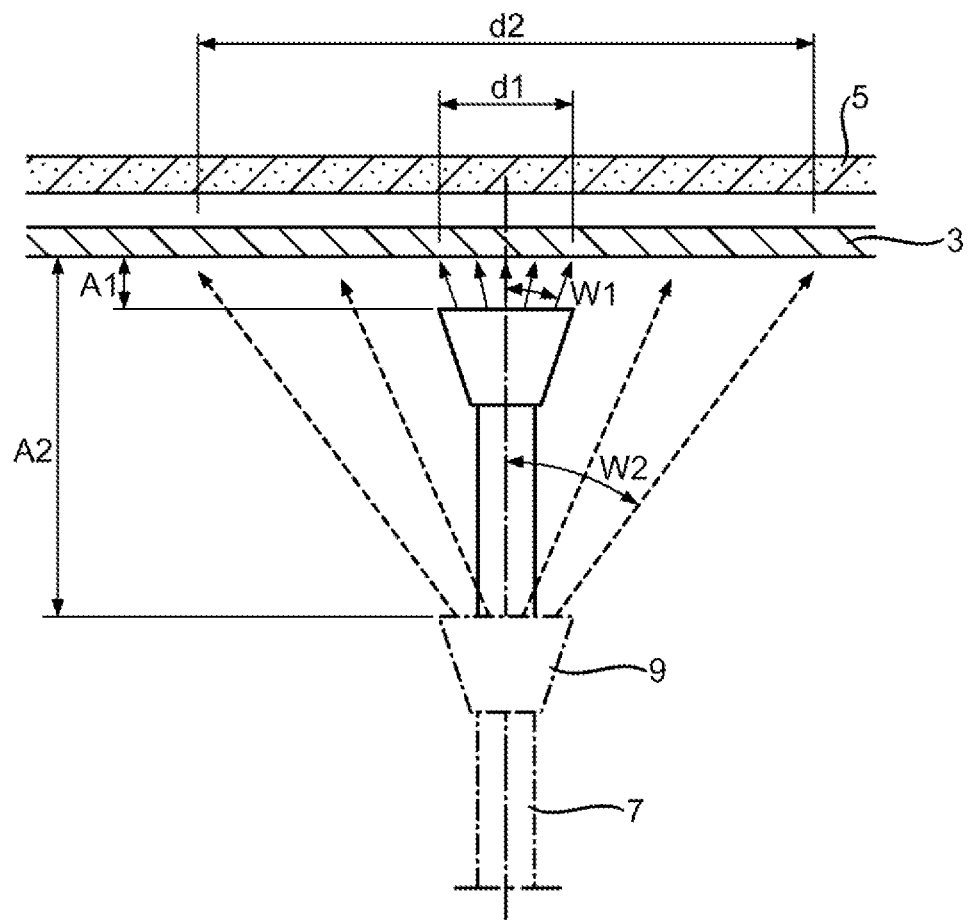
FIG. 2 illustrates in vertical section, the relative position of a gas distributor head of a preferred embodiment with respect to a susceptor and an overlying semiconductor wafer.

The gas distributor head 9 preferably has the form of a conically extended body of revolution, as shown in FIG. 2, and it fans out the gas flow leaving it. Given a ratio of the diameters d/D=0.1, the diameter d1 of the region of the rear side of the susceptor to be cooled may have a length of 38 mm if a semiconductor wafer having a diameter D of 300 mm is to be coated. For this purpose, the distance A1 between the gas distributor head and the rear side of the susceptor should be approximately 11 mm and the gas distributor head should fan out the gas flow leaving it with an opening angle W1 of approximately 20°. Given a ratio of the diameters d/D=0.4, the diameter d2 of the region of the rear side of the susceptor to be cooled preferably has a length of 152 mm if a semiconductor wafer having a diameter D of 300 mm is intended to be coated. For this purpose, the distance A2 between the gas distributor head and the rear side of the susceptor should be approximately 81 mm and the gas distributor head should fan out the gas flow leaving it with an opening angle W2 of approximately 37°.

EXAMPLE

Figure 3:
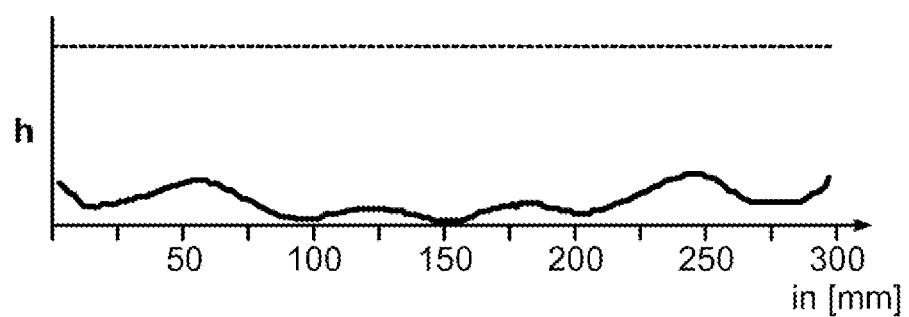
FIG. 3 illustrates the radial distribution of layer thickness h of a silicon semiconductor wafer, coated with a silicon epitaxial layer in a manner according to the invention.
Figure 4:
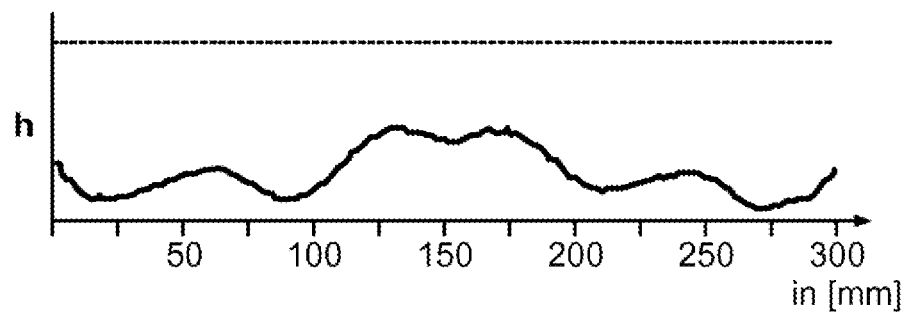
FIG. 4 illustrates a comparative radial distribution of layer thickness h of a silicon semiconductor wafer coated in an otherwise very similar manner, but where cooling of the rear side of the susceptor with a cooling gas was dispensed with during coating.

As shown by the comparison of FIG. 3 and FIG. 4, the radial distribution of the later thickness h is significantly more uniform if the apparatus according to the invention is used. As can be seen, the difference in layer thickness radially across the wafer surface from one edge (0 mm) to the other edge (300 mm) is much more uniform in FIG. 3, where the apparatus of the invention is used to supply a fan of cooling gas to the center region of the wafer than in FIG. 4, where cooling gas is not supplied. Note particularly the increased layer thickness in FIG. 4 near the center of the wafer (150 mm position) as compared to FIG. 3.

The invention claimed is:

1. An apparatus for depositing a layer on a semiconductor wafer by means of vapor deposition, comprising
   a susceptor having a front side facing a semiconductor wafer to be coated, and a rear side;
   a shaft for rotating the susceptor, the shaft having an upper end and a lower end, and a channel extending from the lower to the upper end;
   a gas distributor head fixed to an upper end of the shaft,
   a line for feeding a cooling gas from a cooling gas source to the lower end of the shaft, from where the cooling gas passes through the channel to the upper end of the shaft and into the distributor head and is directed to the rear side of the susceptor, thereby cooling a region of the rear side of the susceptor by means of the cooling gas, wherein the cooled region extends from the center of the susceptor radially outward, wherein the gas distributor head is embodied such that a ratio d/D is not less than 0.1 and not more than 0.4, wherein d denotes the diameter of the cooled region of the rear side of the susceptor and D denotes the diameter of the semiconductor wafer.

2. The apparatus of claim 1, further comprising a device which controls or limits a volumetric flow rate of the cooling gas that leaves the gas distributor head to between 1 slm and 20 slm.

3. In a method for vapor deposition coating a semiconductor wafer placed on a susceptor in a heated reaction chamber, the improvement comprising employing the apparatus of claim 1.

4. In a method for vapor deposition coating a semiconductor wafer placed on a susceptor in a heated reaction chamber, the improvement comprising employing the apparatus of claim 2.

5. The method of claim 3, where the thickness uniformity of a vapor deposited coating on the semiconductor wafer is greater than when cooling of a central area of the rear side of the susceptor is dispensed with.

6. The apparatus of claim 1, wherein the gas distributor head is in the form of a conically extended body of revolution.

* * * * *